United States Patent
Maltezos et al.

(10) Patent No.: US 8,695,355 B2
(45) Date of Patent: Apr. 15, 2014

(54) THERMAL MANAGEMENT TECHNIQUES, APPARATUS AND METHODS FOR USE IN MICROFLUIDIC DEVICES

(75) Inventors: George Maltezos, Fort Salonga, NY (US); Matthew Johnston, Pasadena, CA (US); Axel Scherer, Laguna Beach, CA (US)

(73) Assignee: California Institute of Technology, Pasadena, CA (US)

( * ) Notice: Subject to any disclaimer, the term of this patent is extended or adjusted under 35 U.S.C. 154(b) by 522 days.

(21) Appl. No.: 11/297,106

(22) Filed: Dec. 7, 2005

(65) Prior Publication Data
US 2006/0288708 A1    Dec. 28, 2006

Related U.S. Application Data

(60) Provisional application No. 60/634,667, filed on Dec. 8, 2004, provisional application No. 60/634,668, filed on Dec. 8, 2004.

(51) Int. Cl.
*B01L 3/00* (2006.01)
*F25B 21/02* (2006.01)
*F25B 21/04* (2006.01)

(52) U.S. Cl.
CPC ............... *B01L 3/5027* (2013.01); *F25B 21/02* (2013.01); *F25B 21/04* (2013.01)
USPC ........... 62/3.3; 435/287.2; 204/400; 204/193; 422/68.1

(58) Field of Classification Search
CPC ......... B01L 3/5027; F25B 21/02; F25B 21/04
USPC ......... 62/3.7, 3.3, 259.2; 136/209; 435/287.2, 435/288.5, 303.1; 422/68.1; 204/193, 400
See application file for complete search history.

(56) References Cited

U.S. PATENT DOCUMENTS

| | | | |
|---|---|---|---|
| 3,054,840 A * | 9/1962 | Alsing | 136/204 |
| 5,176,864 A | 1/1993 | Bates et al. | 264/137 |
| 5,228,923 A * | 7/1993 | Hed | 136/208 |
| 5,270,183 A * | 12/1993 | Corbett et al. | 435/91.2 |
| 5,381,848 A | 1/1995 | Trabucco | 164/102 |
| 5,498,392 A * | 3/1996 | Wilding et al. | 422/68.1 |
| 5,584,183 A * | 12/1996 | Wright et al. | 62/3.7 |
| 5,603,351 A * | 2/1997 | Cherukuri et al. | 506/33 |

(Continued)

OTHER PUBLICATIONS

Basic Microfluidic Concepts, retrieved Oct. 13, 2005 from http://faculty.washington.edu/yegerp/microfluidicstutorial/basicconcepts.htm.

(Continued)

*Primary Examiner* — John Pettitt
(74) *Attorney, Agent, or Firm* — Steinfl & Bruno LLP

(57) ABSTRACT

A heating/cooling device for a microfluidic apparatus having a thermal insulating substrate. The device includes heating/cooling chamber for heating and/or cooling a sample disposed in the chamber; a waste heat channel for carrying away waste heat and/or waste cooling; and at least one Peltier junction having first and second opposing faces, the first face thereof facing towards said heating/cooling chamber and being in thermal communication therewith for providing either heat or cooling to the chamber in response to a flow of electrical current through the at least one Peltier junction, the second face thereof facing towards said waste heat channel and being in thermal communication therewith for either receiving heat from or dumping heat to the channel in response to a flow of electrical current through the Peltier junction.

17 Claims, 9 Drawing Sheets

(56) References Cited

U.S. PATENT DOCUMENTS

| | | | |
|---|---|---|---|
| 5,740,051 | A | 4/1998 | Sanders et al. ............... 700/119 |
| 5,876,675 | A * | 3/1999 | Kennedy ......................... 422/99 |
| 5,965,410 | A * | 10/1999 | Chow et al. .................. 435/91.2 |
| 6,074,725 | A | 6/2000 | Kennedy ....................... 428/188 |
| 6,124,138 | A * | 9/2000 | Woudenberg et al. ........ 436/518 |
| 6,193,471 | B1 | 2/2001 | Paul ................................ 417/53 |
| 6,347,521 | B1 * | 2/2002 | Kadotani et al. ................ 62/3.7 |
| 6,572,830 | B1 * | 6/2003 | Burdon et al. ........... 422/186.29 |
| 6,692,700 | B2 * | 2/2004 | Handique ..................... 422/503 |
| 6,875,619 | B2 | 4/2005 | Blackburn |
| 7,244,913 | B2 * | 7/2007 | Murakami et al. ............ 219/385 |
| 2001/0045358 | A1 | 11/2001 | Kopf-Sill et al. ............. 204/452 |
| 2003/0000835 | A1 | 1/2003 | Witt et al. |
| 2003/0015425 | A1 | 1/2003 | Bohm et al. |
| 2003/0235924 | A1 | 12/2003 | Adams et al. |
| 2004/0005720 | A1 * | 1/2004 | Cremer et al. ................ 436/518 |
| 2004/0132218 | A1 | 7/2004 | Ho |
| 2004/0249227 | A1 | 12/2004 | Klapproth et al. |
| 2005/0006372 | A1 * | 1/2005 | Murakami et al. ............ 219/385 |
| 2005/0076651 | A1 * | 4/2005 | Yamashita et al. ............... 62/3.7 |
| 2006/0204699 | A1 | 9/2006 | Maltezos et al. |
| 2006/0263818 | A1 | 11/2006 | Scherer et al. |
| 2007/0012891 | A1 | 1/2007 | Maltezos et al. |
| 2007/0045880 | A1 | 3/2007 | Rajagopal et al. |
| 2008/0013092 | A1 | 1/2008 | Maltezos et al. |
| 2008/0044887 | A1 | 2/2008 | Maltezos et al. |
| 2008/0069733 | A1 | 3/2008 | Maltezos et al. |
| 2008/0083465 | A1 | 4/2008 | Maltezos et al. |
| 2008/0133267 | A1 | 6/2008 | Maltezos et al. |
| 2008/0142157 | A1 | 6/2008 | Maltezos et al. |
| 2008/0145286 | A1 | 6/2008 | Maltezos et al. |
| 2008/0190830 | A1 | 8/2008 | Maltezos et al. |

OTHER PUBLICATIONS

Chiem, N.H., et al., "Microchip-based capillary electrophoresis for immunoassays: analysis of monoclonal antibodies and theophylline", Electrophoresis 19, 3040 (1998).

Chou, H.P., et al."A Microfabricated Rotary Pump", *Biomedical Microdevices* 3, 323 (2001).

Clark, A.M., et al., "Cooling of bulk material by electron-tunneling refrigerators", *Applied Physics Letters* 86, 173508 (2005).

Fan, X., et al., "SiGeC/Si superlatice microcoolers", *Applied Physics Letters*, vol. 78, No. 11, pp. 1580-1583 (Mar. 12, 2001).

Fiedler, S., et al., "Dielectrophoretic sorting of particles and cells in a microsystem", *Anal. Chem.* 70, 1909 (1998).

Fu, A.Y., et al., "A microfabricated fluorescence-activated cell sorter", *Nature Biotech.* 18, 309, 309 (2000).

Godfrey, S., "Electronics Cooling: An introduction to the thermostatic coolers", retrieved Oct. 10, 2005 from http://www.electronics-cooling.com/Resources/EC_Articles/SEP96.

Hadd, A.G., et al., "Microchip device for performing enzyme assays", *Anal. Chem.* 69, 3407 (1997).

Ikuta, K., et al., "Biochemical IC chip toward cell free DNA protein synthesis", MEMS 2000, Miyakazi, Japan,pp. 131-136 (Jan. 23-27, 2000).

Ikuta, K., et al:, "Fluid drive chips containing multiple pumps and switching valves for Biochemical IC Family", *MEMS* 1998, Heidelberg Germany, pp. 739-744 (Jan. 25-29, 1998).

Jeon, N.L., et al., "Microfluidics Section: Design and Fabrication of Integrated Passive Valves and Pumps for flexible Polymer 3-dimensional Microfluidic systems", Biomedical Microdevices 4:2, pp. 117-121 (2002).

Kopp, M.U., et al., "Chemical amplification: continuous flow PCR on a chip", *Science* 280, 1046 (1998).

Lagally, E.T., et al., "Monolithic integrated microfluidic DNA amplification and capillary electrophoresis analysis system", *Sensors and Actuators B-chemical* 63 (3): 138-146 (May 15, 2000).

Lee, J., et al., "Two Phase flow in high heat flux microchannel heatsink for refrigeration cooling applications: Part II-heat transfer characteristics", *International Journal of Heat and Mass Transfer*, 48, pp,941-955 (2005).

Lee, H., et al., "Package embedded heat exchanger for stacked multichip module" retrieved Dec. 20, 2006 from http://www.mrs.org.sg/icmat2005/downloads/SymF-Template.pdf.

Li, P.H., et al., "Transport, manipulation and reaction of biological cells on-chip using electrokinetic effect"; *Anal. chem* 69, 1564 (1997).

Liu, J., et al., *Electrophoresis*, 23, 1531 (2002).

Morgan, H., et al., "Large Area travelling-wave dielectrophoresis particle seperator", *Journal of Microengineering*, 7, 65 (1997).

Peltier-Seebeck Effect-wikipedia, retrieved Oct. 10, 2005 from http://en.wikipedia.org/wiki/Peltier-Seebeck_effect.

"Peltier Coolers", retrieved Oct. 10, 2005 from http://www.digit-life.com/articles/peltiercoolers/.

Quake, S.R., et al, "From Micro to Nano Fabrication with Soft Materials", *Science* 290, 1536 (2000).

Thorsen, T., et al., "Microfluidic Large-Scale Integration", *Science* 298,5593 (2002).

Unger, M.A., et al., "Monolithic Microfabricated Valves and Pumps by Multilayer Soft Lithography", *Science* 288, 113 (2000).

Waters, L.C., et al., "Microchips devices for cell lysis, multiplex PCR amplification, and electrophoretic sizing", *Anal. Chem.* 70, 158 (1998).

Wu, H.K., et al., "Fabrication of complex three-dimensional microchannel systems in PDMS", Journal of Te American Chemical Society 125 (2),pp. 554-559 (Jan. 15, 2003).

Kartalov, Emil P. et al "Microfluidic device reads up to four consecutive base pairs in DNA sequencing-bysynthesis" in Nucleic Acids Research, 2004, 32 (9). pp. 2873-2879.

Unger Marc A. et al "Monolithic Microfabricated Valves and Pumps by Multilayer Soft Lithography", in Science, Apr. 7, 2000, vol. 288. No. 5463, pp. 113-116.

Kartalov, Emil P. et al High-throughput multi-antigen microfluidic fluorescence immunoassays in Biotechniques 2006, vol. 40, No. 1: pp. 85-90.

Piyasena Menake E., et al. "Near-Simultaneous and Real-Time Detection of Multiple Analytes in Affinity Micro columns" in Anal. Chem. 2004, 76, 6266-6273.

Hernandez L. et al. "Determination of Binding Constants of Polyethylene Glycol Vancomycin Derivatives to Peptide Ligands Using Affinity Capillary Electrophoresis" in Chromatographia Mar. 2007, vol. 65, No. 5-6.

PCT International Search Report for PCT/US2007/078689 filed on Sep. 18, 2007 in the name of California Institute of Technology, et al.

PCT Written Opinion for PCT/US2007/078689 filed on Sep. 18, 2007 in the name of California Institute of Technology, et al.

Inatomi, K., S. Izuo, S. Lee, H. Ohji, S. Shiono, Electrophoresis of DNA in micro-pillars fabricated in polydimethylsiloxane, Microelectronic Engineering, vol. 70 (2003) pp. 13-18.

\* cited by examiner

THERMAL MANAGEMENT TECHNIQUES, APPARATUS AND METHODS FOR USE IN MICROFLUIDIC DEVICES

CROSS REFERENCE TO RELATED APPLICATIONS

This application hereby claims the benefits of U.S. Provisional Patent Application No. 60/634,667 filed Dec. 8, 2004 and also claims the benefits of U.S. Provisional Patent Application No. 60/634,668 filed Dec. 8, 2004.

This disclosure is related to U.S. Provisional Patent Application Ser. No. 60/634,668 filed Dec. 8, 2004 and to its related U.S. patent application Ser. No. 11/297,651 filed contemporaneously with this application and entitled "Prototyping Methods and Devices for Microfluidic Components", the disclosure of which is hereby incorporated herein by reference. This disclosure is also related to U.S. patent application Ser. No. 11/297,124 filed contemporaneously with this application, and entitled "Parylene Coated. Microfluidic Components and Methods for Fabrication Thereof", the disclosure of which is also hereby incorporated herein by reference.

FEDERAL SUPPORT

This invention was made with U.S. Government support under contract No. R01 H6002644 awarded by the National Institute of Health. The U.S. Government has certain rights in this invention.

TECHNICAL FIELD

This disclosure relates to heating and cooling devices, preferably micro-Peltier junctions, which may be used in microfluidic devices.

BACKGROUND

The construction of compact and monolithic chip-sized laboratories and reaction systems is now possible with the advent of dense integration of microfluidic components on small chips. Chip-sized laboratories and reaction systems can analyze and/or process very small samples of liquids, for example, samples in the 10-200 nano-Liter (nL) size range. Such chip-sized laboratories and reaction systems require many different functions to be miniaturized and combined on a common substrate. Some useful chip-based operations include mixing, filtering, metering, pumping, reacting, sensing, heating and cooling of nano-liter volumes of sample fluids. In such systems, smaller amounts of samples can be analyzed in less time, as little material is lost by transferring samples from one reaction vessel to another. So far, much work has been performed on defining and integrating fluidic components that can perform such on-chip mixing, sorting, and reacting of fluids. By combining thousands of lithographically defined pumps and valves into chip-based systems, it is possible to obtain unprecedented control over reagent concentrations and perform many reactions in parallel. However, one largely unexplored area for microfluidic devices has been the miniaturization of thermal management systems, such as refrigerators and heaters to control the local temperature of a reaction. Typically, in the prior art, the entire chip is heated or cooled, which seriously limits the kind of independent operations that can be performed on such chips.

Many different approaches have so far been explored for thermal control, including the construction of resistive heating elements within fluidic chambers, and immersing the entire chip into coolant. For example, polymerase chain reaction (PCR) systems for DNA amplification have been fabricated with volumes as small as 12 nano-Liters based on lithographically defined resistive tungsten heaters. See J. Liu, M. Enzelberger, and S. R. Quake, *Electrophoresis*, 23, 1531 (2002) and Lagally E T, Simpson P C, Mathies R A, *Sensors and Actuators B-Chemical* 63 (3): 138-146 May 15, 2000.

The prior art approaches have several problems:

First, while they may address the heating of small fluidic volumes, they do not address the cooling of those volumes. Having started a reaction, once the reaction has reached its end point, it can be very important to stop it, such as by cooling it.

Second, both the heating and cooling of small fluidic volumes need be done quickly.

Third, the small fluidic volumes need to remain captured while being heated. A common material currently used for microfluidic devices is polydimethylsiloxane (PDMS). PDMS is used since it enjoys good mechanical and thermal properties. However, one draw back of PDMS is that fluids, when heated, are likely to seep into the PDMS material. This is unsatisfactory for at least two reasons: (i) the samples under test are partially or totally lost when heated and (ii) the microfluidic device becomes contaminated by the seeping fluids.

This disclosure demonstrates that micro-Peltier junctions provide good mechanisms for heating and cooling of samples in microfluidic devices. And the patent application which is incorporated by reference explains in even greater detail than is explained below how certain special materials can be used to provide a very thin fluid-impervious layer on PDMS so that heating/cooling chambers provided in microfluidic devices made from PDMS can be protected against fluid samples seeping out of the heating/cooling chambers and into the surrounding PDMS material.

Furthermore, use of micro-Peltier junctions provides an even more versatile method of thermal control, which permits both local heating and cooling of reaction chambers and the controlled redistribution of heat loads on microfluidic chips. The integration of such heating and refrigeration systems with microfluidic valves and pumps is straight forward. The present disclosure describes the temperature dependence on the current applied to micro-Peltier junctions as well as the microfluidic heat exchange flow. The technology described here is expected to be particularly useful for the definition of micro-PCR systems, as well as for many analytical biochemical reaction and testing systems.

BRIEF DESCRIPTION OF THE INVENTION

In one respect the present invention relates to heating/cooling devices for a microfluidic apparatus having a thermal insulating substrate. The device includes: a heating/cooling chamber for heating and/or cooling a sample disposed in the chamber; a waste heat channel for carrying away waste heat and/or supplying thermal energy; and at least one Peltier junction having first and second opposing faces, the first face thereof facing towards said heating/cooling chamber and being in thermal communication therewith for providing either heat or cooling to said chamber in response to a flow of electrical current through the Peltier junction, the second face thereof facing towards the waste heat channel and being in thermal communication therewith for either receiving heat from or dumping heat to the channel in response to a flow of electrical current through the at least one Peltier junction.

In another aspect the present invention provides a fluidic chip comprising: a substrate; one or more layers of a heat insulating material supported by said substrate; a plurality of fluid conduits or channels formed in said one or more layers of heat insulating material; at least one sample chamber formed in said one or more layers of heat insulating material for heating or cooling a sample in said at least one sample chamber, said at least one sample chamber being in fluid communication with selected ones of said fluid conduits or channels; and at least one electronic junction device disposed adjacent said at least one sample chamber, said at least one electronic junction device having a first heat transfer surface disposed in heat flow relationship with said at least one sample chamber, said at least one electronic junction device also having a second heat transfer surface disposed in heat flow relationship with other ones of said fluid conduits or channels formed in said one or more layers of heat insulating material.

In yet another aspect the present invention provides a fluidic chip comprising: a substrate; a layer of a heat insulating material supported by said substrate; a plurality of fluid conduits or channels formed in said layer of a heat insulating material; at least one heating chamber formed in said layer of heat insulating material for heating a sample in said at least one heating chamber, said at least one cooling chamber being in fluid communication with selected ones of said fluid conduits or channels; and at least one Peltier heating junction device disposed adjacent said at least one cooling chamber, said at least one Peltier heating junction device having a heating surface disposed in heat flow relationship with said at least one cooling chamber, said at least one Peltier heating junction device also having a heat receiving surface disposed in heat flow relationship with other ones of said fluid conduits or channels formed in said layer of heat insulating material for receiving heat therefrom for transmission to said at least one heating chamber.

Figure 1:
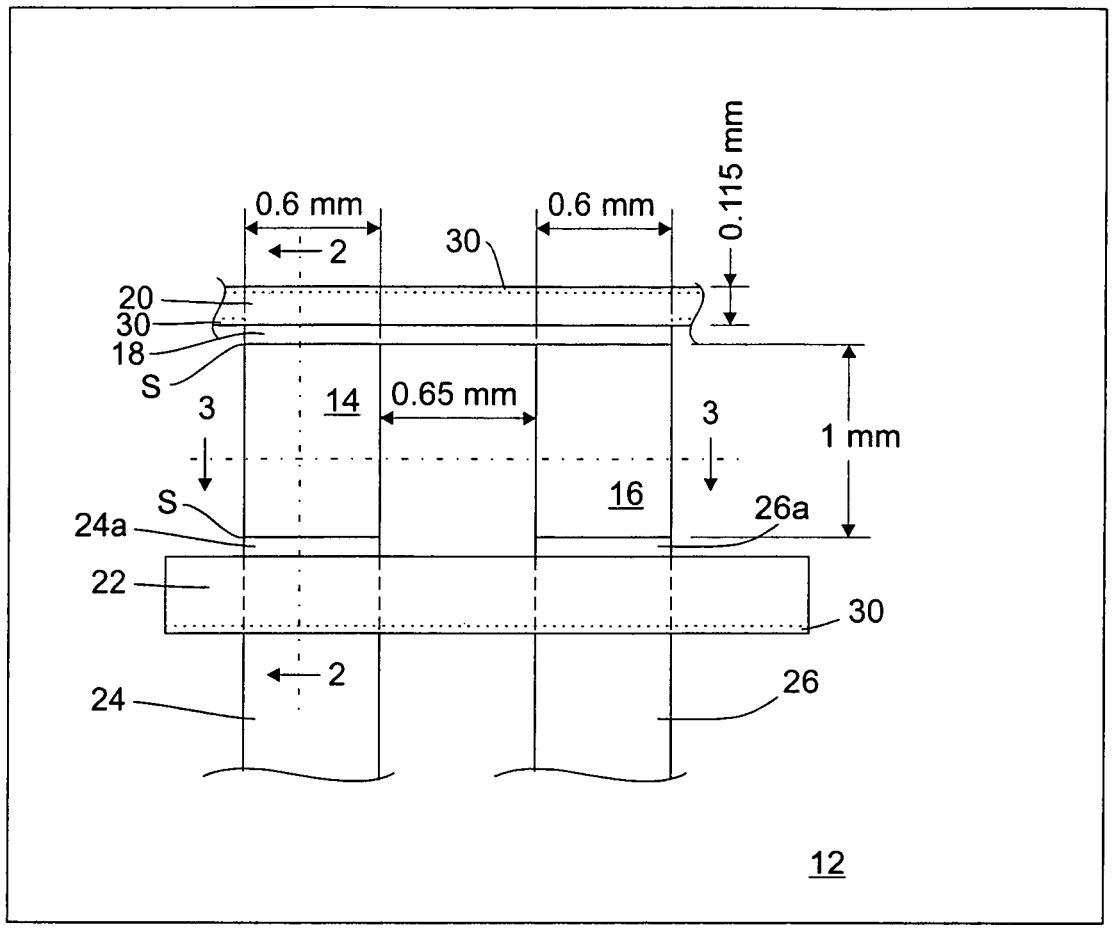
FIG. 1 is a plan view of a pair of micro-Peltier junctions disposed on a thermally insulating substrate.

The dimensions and measures shown in the drawings are for explanation purposes only and should not be constructed to limit the claims.

DETAILED DESCRIPTION OF SEVERAL EMBODIMENTS OF THE INVENTION

FIG. 1 is a plan view of a pair of micro-Peltier junctions 14, 16 disposed on a thermally insulating substrate 12. In this embodiment the thermally insulating substrate 12 is preferably made from PDMS and, in this embodiment, the substrate 12 is preferably provided by a thin layer of PDMS 12 which is mechanically supported by a thicker sheet or substrate of another material, such as glass or silicon 10 (see, for example, FIG. 2). Micro-Peltier junctions are currently commercially available from Marlow Industries Incorporated of Dallas, Tex.

In FIG. 1 the device is preferably embedded in a layer of PMDS overlaying the components and elements depicted in FIG. 1, but for that sake of clarity, the overlaying layer is removed in this particular view. The overlaying layer 28 can be seen, for example, in the various sectional views taken through FIG. 1.

A fluidic chamber 20 in which heating and/or cooling can occur is disposed near an end of the two micro-Peltier junctions 14, 16. As will be seen, more than two micro-Peltier junctions 14, 16 may be used to heat and/or cool a sample and, indeed, only one micro-Peltier junction can be used to both heat and cool a sample, but by using more than one micro-Peltier junction, greater heating and cooling speeds are obtained. Since two micro-Peltier junctions 14, 16 are depicted, they are both connected to a source of DC current (not shown) via a pair of conductive ribbons 24, 26. The micro-Peltier junctions 14, 16 are connected in series in this embodiment, and therefore one of the conductive ribbons 24 is connected to a face of one micro-Peltier junction 14 while the other conductive ribbon 26 is connected to a face of the other micro-Peltier junction 16. The two micro-Peltier junctions 14, 16 are further connected, on their opposite faces, to a conductive ribbon 18. The conductive ribbons 18, 24 and 26 are preferably made of copper, or other suitable electrically and thermally conductive material, and micro-Peltier junctions 14, 16 are preferably attached to the conductive ribbons 18, 24, 26 by soldering or other suitable bonding technique. The ribbons 24 and 26 preferably have a bent-up portion (see, for example, portion 24a in FIG. 2) confronting the faces of the micro-Peltier junctions 14, 16 where the bonding (preferably soldering) occurs, the bent up portions assisting in carrying heat away from the Peltier junctions when needed or to the Peltier junctions when needed. The size of the bent up portions (such as 24a) are preferably the same size as the confronting faces of the Peltier junctions 14, 16 which are preferably 0.6 mm by 0.6 mm for the reason mentioned above. The size of the conductive ribbon 18 (as measured facing the Peltier junctions) is preferably 0.6 mm by 1.85 mm in this embodiment. Also, in this embodiment, the size of the conductive ribbon measured facing the chamber 20 is the same as its size facing the Peltier junctions; however, the height of chamber 20 (shown with the 0.6 mm dimension in FIG. 2) may be reduced if a smaller sample volume is desired and if the height of the Peltier junction is to remain at 0.6 mm as shown, then the conductive ribbon may have a smaller height facing the sample than facing the Peltier junction which can be easily obtained if the ribbon conductor is provided with a trapezoidal or a trapezoidal-like configuration in the cross section view of FIG. 2.

In the series-connected embodiment of FIG. 1, one of the micro-Peltier junctions would be an N-type junction while the other would be P-type. Which is which does not particularly matter in FIG. 1, since, as those skilled in the art will appreciate, the Peltier cooling and heating effect is governed by both the junction types and the direction of DC current flow. So in FIG. 1, for ribbons 24 and 26, if one is connected to a relatively positive DC supply voltage, either cooling or heating will occur at ribbon 18 and if the polarity of the connection is reversed, then heating will replace cooling (or visa versa, cooling will replace heating). In any event, the heating and cooling of a sample in chamber 20 is controlled on the basis of the direction of current flow through the two micro-Peltier junctions 14, 16.

The fluidic chamber 20 is disposed adjacent conductive ribbon 18. Depending on the types of reactions to be preformed in the chamber 20, the conductive ribbon 18 can be in direct contact with the interior of chamber 20 or can be chemically isolated there from by using a suitable material, such as glass or a fluorinated compound such as Sifel (Sifel is a registered trademark for curable liquid fluorocarbon elastomer), pfpe (perfluoropolyether) or parylene. A glass-isolated chamber embodiment is discussed in greater detail later in this patent.

A heat flow channel 22 is disposed adjacent the opposite faces of the two micro-Peltier junctions 14, 16 and preferably is disposed immediately adjacent the bent-up portions 24a and 26a of the ribbons 24 and 26 attached to the faces of micro-Peltier junctions 14 and 16. The heat flow channel 22 carries away waste heat when the micro-Peltier junctions 14, 16 are connected to cool the contents of chamber 20 and conversely the heat flow channel 22 carries away waste cooling when the Peltier junctions 14, 16 are connected to heat the contents of chamber 20. The heat flow channel typically contains a pumped (moving) fluid, such as water or another heat conveying fluid, to convey waste heat and/or waste cooling off chip.

Many thousands of heating/cooling chambers 20 can be built into a single microfluidic chip and thus the heat flow channel 22 depicted in FIG. 1 may be connected in any convenient arrangement with other heat flow channels associated with other heating/cooling chambers similar to chamber 20 built into the chip. The heat can be transferred from the chambers 20 to the common heat or cooling channel 22 by means of lithographically defined and etched copper that goes between them. The copper can be coated with a very thin layer, if desired, with spin on glass, PFPE, or SIFEL®, as described in the 11/297651 application incorporated by reference above.

Figure 2:
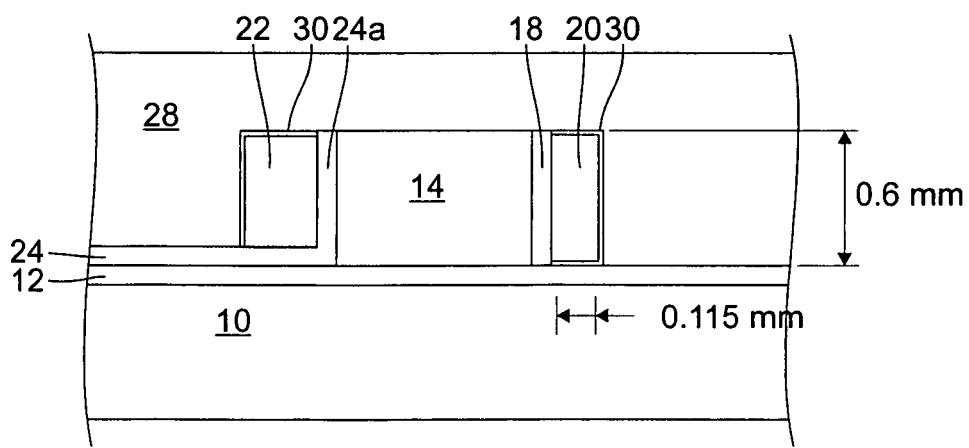
FIG. 2 is a section view through the device of FIG. 1 taken along line 2-3 thereof and of the device of FIG. 4 taken along line 2-3 thereof.
Figure 3:
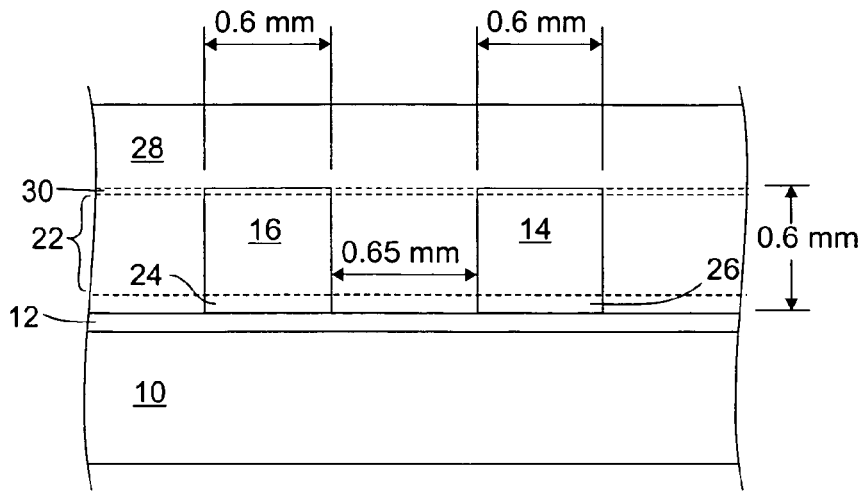
FIG. 3 is a section view through the device of FIG. 1 taken along line 3-3 thereof.

The chamber 20 in FIGS. 1-3 has a length of about 1.8 mm, a width of 0.115 mm and a depth of 0.6 mm, so its volume is about 170 nL. These sizes are largely governed by the sizes of the micro-Peltier junctions, which are currently available in a 1 mm by 0.6 mm by 0.6 mm size and by the fact that the minimum feature width using the preferred PDMS fabrication technique is 0.115 mm. The preferred PDMS fabrication technique is discussed in the related US Patent Application identified above and incorporated hereby by reference.

In summary, FIG. 1 depicts a micro-Peltier cooler encapsulated within a replication molded elastomeric chip preferably using PDMS technology. In the resulting chips, the Peltier junction 14, 16 is used as a heat pump to transfer heat from the microfluidic chamber 20 into an adjacent channel 22 which preferably uses water as a microfluidic heat exchanger fluid. The Peltier device is preferably embedded within a polydimethylsiloxane (PDMS) replication mold, making this device compatible with this most common microfluidic material. The molds for this device are made by three-dimensional fabrication or photoresist which allows for a large surface area to be presented to the face of the Peltier device while still minimizing volumes of the chamber and channel. The bus bar ribbon 18 joins p and n junctions of the Peltier devices to chamber 20 to improve thermal transfer, while a similar copper/fluid heat exchanger is provided on the heat transfer channel 22 side to maximize the thermal transfer from non-chamber sides of the Peltier devices to the heat-sink channel 22. Thermal isolation is achieved through the low thermal conductivity of PDMS. The Peltier devices are preferably each a 0.6×0.6×1.0 mm³ diced piece of p-type and n-type thermoelectric materials with nickel and gold applied to the end faces to facilitate solder connections, obtained from Marlow Industries Incorporated and soldered to the ribbons that are sealed and isolated through a two-component elastomer (elements 12 and 28) and connected to a constant current power supply (not shown).

Figure 6:
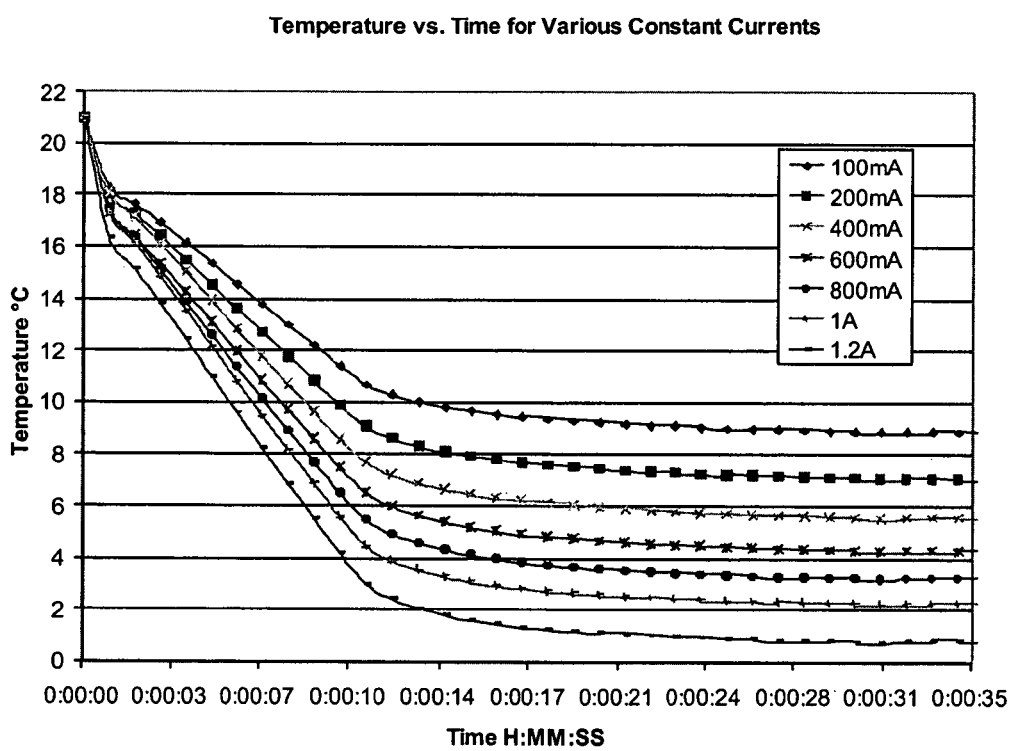
FIG. 6 is a graph showing the temperature versus time for various electrical currents for an experiment which was performed.
Figure 7:
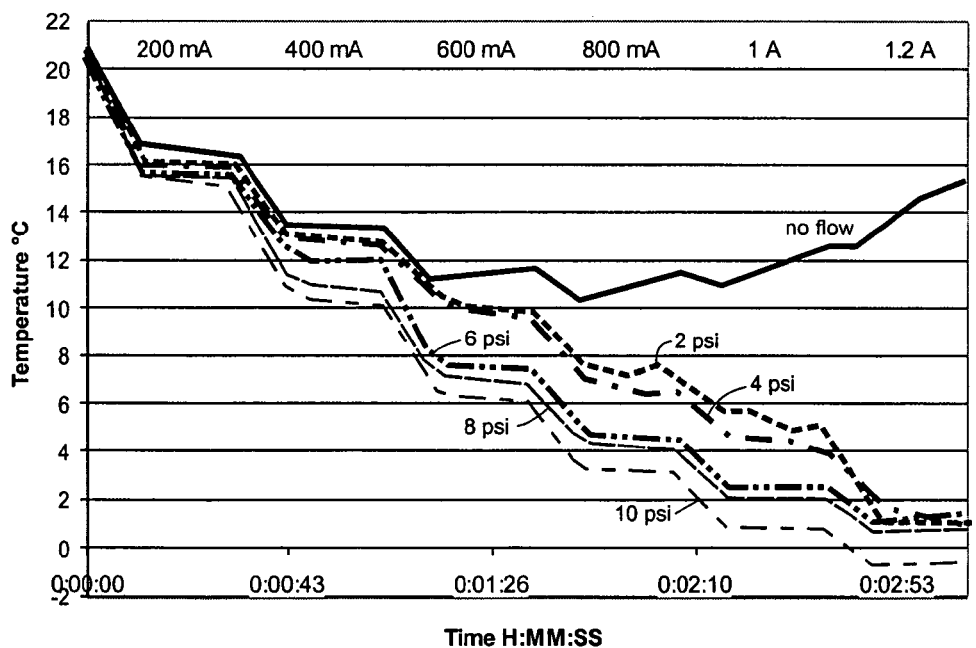
FIG. 7 is a graph showing the temperature versus time for various cooling water flow rates with increasing current.

To conduct measurements of the refrigeration temperature and rate, one side of the Peltier junction was heat sunk with a microfluidic flow channel 22 in which the flow rate was measured to observe the effect of heat exchange on this device. The sample chamber 20 side of the junction consists of a small fluidic chamber 20, 169 nl in volume for the test, which also contained a 0.001 inch diameter, bare wire, type K thermocouple to measure the temperature of the refrigerated material. As current is applied to the micro-Peltier junctions, the chamber can be cooled down within approximately 10 seconds (see FIGS. 6 and 8). The ultimate temperature depends on the current applied to the thermoelectric cooler as well as the flow rate and temperature of the heat exchanger liquid. FIG. 7 demonstrates such a temperature dependence of the refrigerated liquid as a function of current and flow rate with the cooling water kept at 25° C. Several temperature curves are shown for various heat exchange flow rates as the Peltier current is increased in steps of 200 mA. As the cooling water flow is increased, the better the effectiveness of the Peltier junctions at lowering the temperature in the chamber 22. The effect of no cooling water flow is shown by the curve which heats up after 800 mA, in which case the resistive heating of the Peltier devices overwhelms their cooling power due to the lack of an effective heat sink. A sub-zero temperature can be obtained when the highest heat exchange flow rates and large currents (of approximately 1.2 A) are applied to the Peltier devices. Ultimately, this temperature is limited by a balance between the resistive heating of the junctions at high applied currents and the cooling action from the Peltier effect, as described in the following equation:

$$q_c = \alpha_n I T_1 - \frac{\lambda A \Delta T}{L} - \frac{I^2 R}{2}$$

where R is the resistance, I is the applied current to the Peltier devices, α is the Seebeck coefficient, λ is the thermal conductivity, A is the surface area and L is the length.

Figure 8:
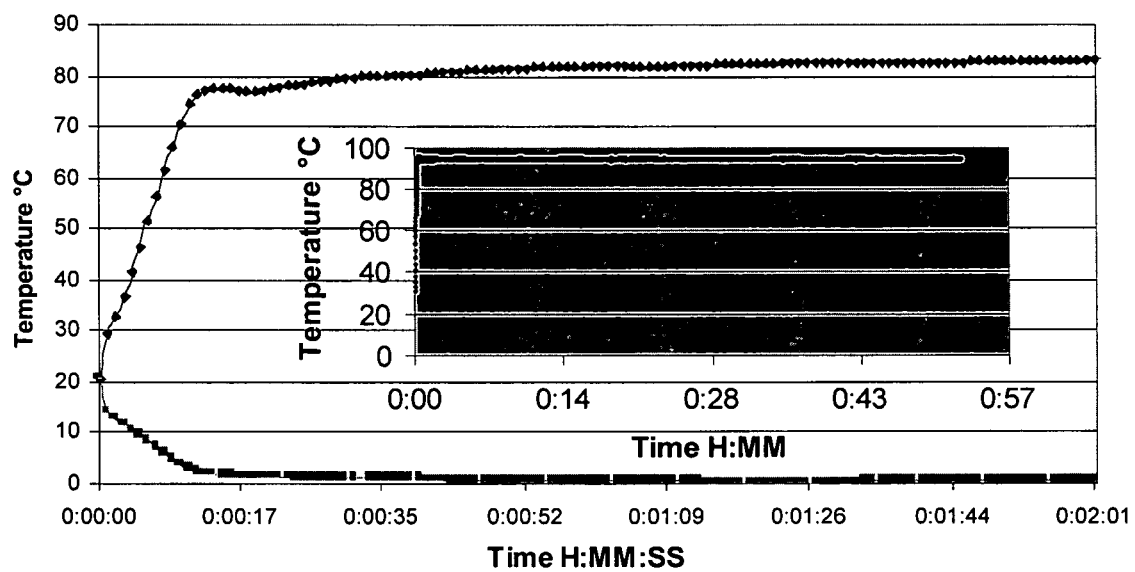
FIG. 8 is a graph showing temperature ramp rates for both thermo-electric heating and cooling, while its inset graph shows a heating run at 94.7° C. with a standard deviation of 0.2 degrees C. over almost an hour. The applicants have demonstrated ramp rates of 60.5 degrees per second.

During our measurements, the chamber 20 temperature was monitored by a thermocouple embedded in the chamber, to obtain response results as functions of electrical current, heat exchange fluid flow and time. The resulting curves can be used to optimize the temperature and ramp rate of the micro-Peltier devices. For many applications, such as quantitative PCR, it is also important to demonstrate constant temperatures with accuracies of 0.1° C., and we have measured the time-dependent response of the chamber temperature over several hours of refrigeration or heating. The inset graph of FIG. 8 shows a typical thermal stability plot for our refrigerator when operated with a simple labview program to control temperature. These preliminary temperature control results are very encouraging, reaching an average temperature of 94.7° C. with a standard deviation of 0.2 degrees C. over almost an hour.

The micro-Peltier devices 14, 16 were used as both an on-chip refrigerator and heat exchanger for microfluidic devices. The microfluidic chamber 20 was cycled between −3 and over 120 degrees Celsius, thus spanning water freezing and boiling, and the entire PCR temperature range. The Applicants have determined that it is possible to cool reagent from room temperature to freezing within 10-20 seconds, and to obtain relatively good temperature (<+0.2° C.) stability over long periods of time. The ability to localize heating and cooling in microfluidic chambers 20 and channels 22 will enable massive parallelization of chemical reactions in a single chip in which the temperature of each reaction chamber can be independently controlled. This enables very complex chemical and biochemical reactions to be carried out with precise temperature schedules on miniaturized fluidic chips. Moreover, important analytical and functional temperatures can be changed very rapidly or held constant. For instance, one chamber can be frozen in order to store a cell, while another can be boiled in order to sterilize it, whereas yet another chamber can cycle the temperature in order to perform PCR.

Figure 4:
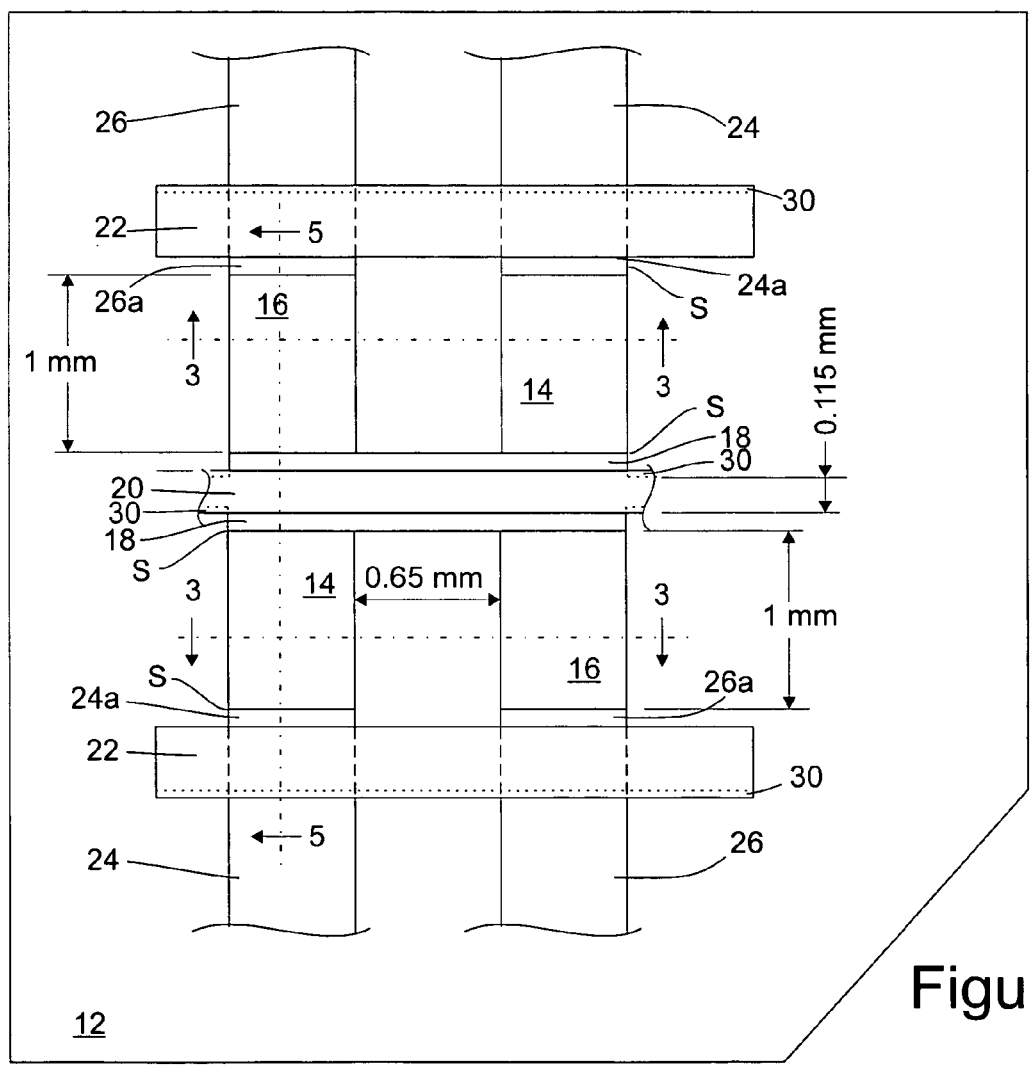
FIG. 4 is a plan view of another embodiment having two pairs of micro-Peltier junctions disposed on a thermally insulating substrate.
Figure 5:
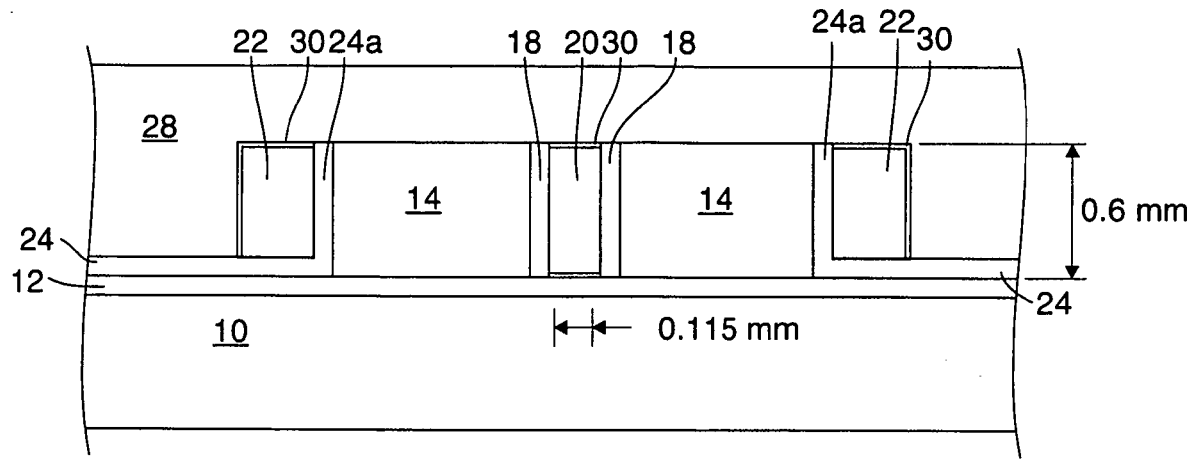
FIG. 5 is a section view through the device of FIG. 4 taken along line 5-5 thereof.
Figure 5A:
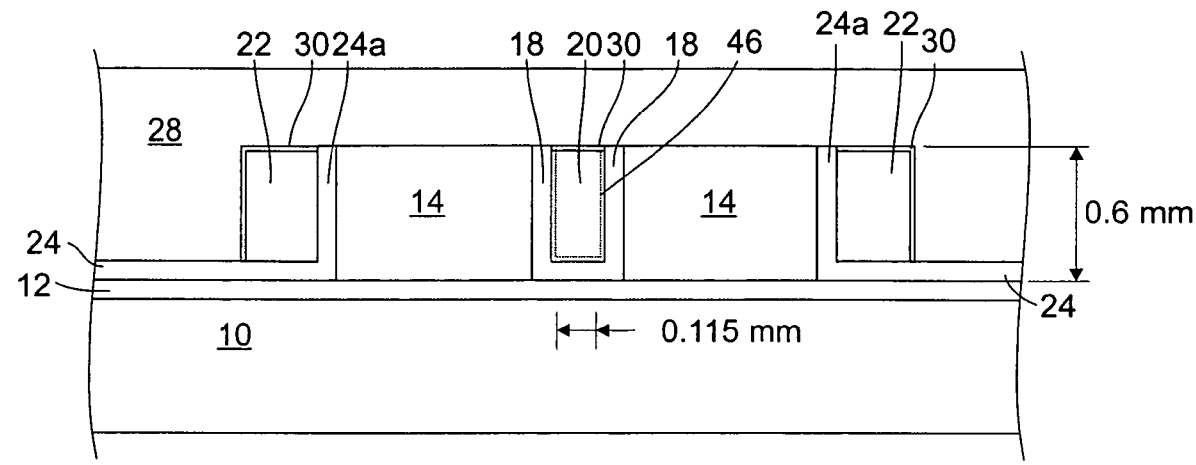
FIG. 5a is also section view through the device of FIG. 4 taken along line 5-5 thereof, but showing an alternative arrangement for the bus ribbon.

The embodiment of FIGS. 1-3 show are device with two micro-Peltier devices 14, 16. The embodiment of FIGS. 4 and 5 is similar, but this embodiment has two pairs of micro-Peltier devices 14, 16 disposed on opposite sides of the chamber 20. The devices 14, 16 in each pair are preferably wired in series, but, if wired in series, then the pairs themselves may be wired in parallel or series with each other. In FIG. 4, the upper pair in the figure and the lower pair in the figure may be wired together in parallel. If wired in parallel with each other then their heat sink bus ribbons 18 may be coupled together as shown to assume a 'U' shape configuration are shown in the embodiment of FIG. 5a since both bus ribbons 18 in FIG. 5 should then be at the same potential. The heat sink 18 may alternatively have a box like, square or circular shape (or any other convenient shape) in cross section. The fluid sample in chamber 20 can be protected so that it does not travel into the surrounding material 28 (which is preferably PDMS) by using a barrier 30, described below, or by using a containment vessel 46, which may be formed of glass which is in tight contact with the interior of bus 18. As will be seen with reference to the embodiment of FIGS. 11 and 12, the glass vessel 46 can be formed from a glass fiber or capillary tube.

In the embodiments of FIGS. 1-5a, a thin barrier 30 having a thickness in the range of about 50 nm to several microns (for example about 2 μm) is to used to help ensure the fluid in chamber 20 does not seep into the otherwise somewhat porous surrounding PDMS material 12, 28. The barrier may be a very thin layer 30 of a liquid impervious material, preferably parylene, SIFEL®B, PFPE or spin on coatable glass as described in the related US patent application mentioned above. As is described therein a liquid impervious material is disposed on the exposed interior surfaces of chamber 20. The heat transfer channel(s) 22 also preferably has the same barrier material 30 as depicted in these figures. The barrier 30 is used in the chamber 20 to try to keep fluid in the chamber from seeping or otherwise traveling into the surrounding PDMS material 12, 28. The seepage problem is more pronounced when the fluid is subject to heating and this issue is of most concern since a sample under test in chamber 20 can otherwise seep away. The barrier 30 may be used with the heat transfer channel(s) 22 as well because it is helpful to contain the heat conducting fluid therein and, in any event, it may well be easier to include it during manufacture (since both the chamber and the channels will be likely manufactured at the same time using similar or identical processing steps) as opposed to taking additional steps to exclude it from the heat transfer channel(s) 22.

Sensors may be included with or adjacent chamber 20 to make temperature measurements or to test whether some chemical reaction has completed. For example, certain dyes used to measure the state of a PCR and the color of the dye (and hence the state of the reaction) can be measured in the chamber 20 by using a laser and a light detector disposed on opposite sides of the chamber 20. The use of lasers and other detectors will be discussed subsequently with respect to some additional embodiments, but it should be understood that they will often be used with any or all of the disclosed embodiments.

The chambers 20 and the heat transfer channels 22 are preferably formed in PDMS layer 28 using the lost wax and wax printer technology discussed in the related US patent application mentioned above. The Peltier junctions are preferably disposed in chambers formed in PDMS layer 28 again preferably using the lost wax and wax printer technology discussed in the related US patent application mentioned above.

Figure 9:
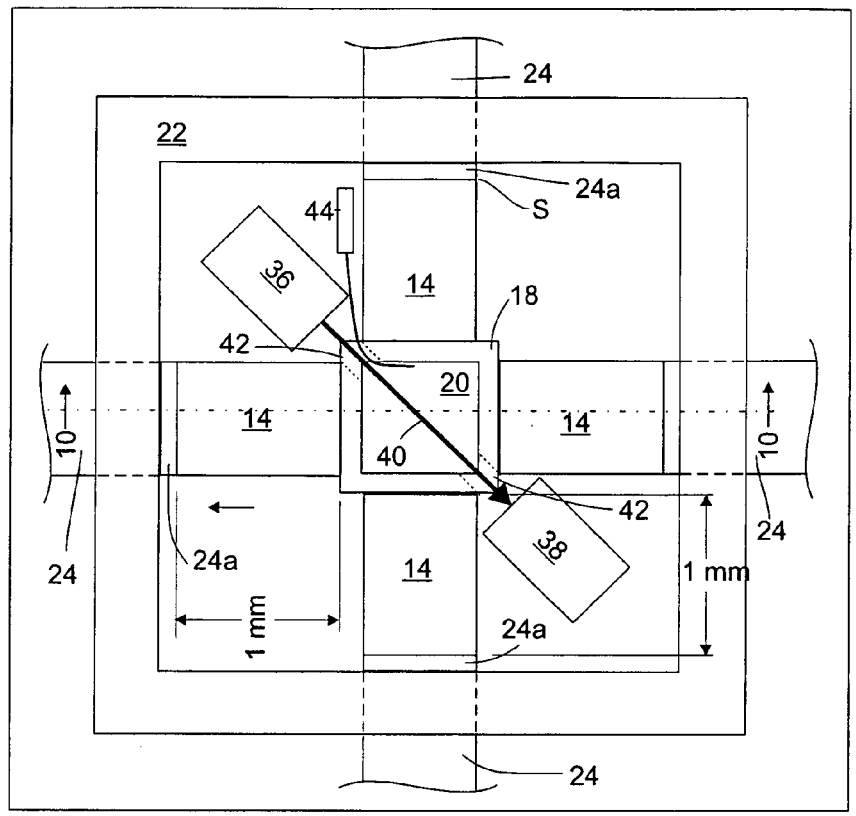
FIG. 9 is a plan view of an embodiment which preferably has four Peltier junctions surrounding a heating/cooling chamber.
Figure 10:
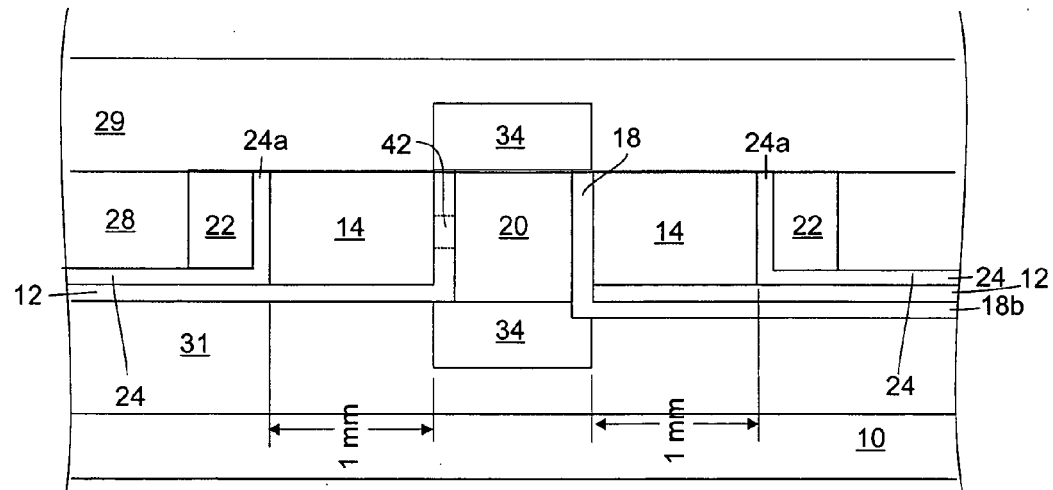
FIG. 10 is a side section view through the embodiment of FIG. 9 taken along line 10-10 thereof.

Turning now to the embodiment of FIGS. 9 and 10, in FIG. 9 a central chamber 20 is shown surrounded by four Peltier junctions 14, all of which are of a common conductivity type and all of which are connected in parallel in this embodiment. In this embodiment the sample chamber 20 is approximately 0.6 mm on a side (using the aforementioned Peltier junctions that are currently commercially available), so the volume of the chamber 20 is about five times bigger than the embodiment of FIGS. 1-5a. Valves 34 are preferably disposed above and below the chamber 20 to help control the passage of samples through the chamber 20. Fluid lines (not shown) in the layer above (see layer 29) and layer below (see layer 31) layer 28 couple with the valves 34 and to the heat transfer channel 22 as needed on the microfluidic chip. Suitable sensors may also be used. An optional laser is shown at numeral 36, which may be implemented by a laser diode, while an optional detector therefore is shown at numeral 38. A laser beam 40 passes through apertures 42 in the wall of bus bar 18 and through chamber 20 for the purpose of detecting at detector 38 a change of color of a sample in chamber 20. The apertures 42 are filled with a suitable transparent (to the color of the laser) material, such as quartz, glass, PDMS, paralene, spin on glass, or combinations thereof The change of color can be triggered, for example, by suitable dyes used in PCR. An optional temperature detector is shown at numeral 44, the purpose of which is measure the temperature of a sample in chamber 20. The probe of the temperature detector 44 may also pass through one of the apertures 42.

All of the conductive ribbons 24 would be connected, in common, to a source of DC power (not shown) while the other conductor 18, which surrounds the chamber 20 in FIG. 9, would also be connected to the source of DC power preferably via a conductive leg 18b (see FIG. 10). Whether heating or cooling occurred in chamber 20 would depend on the polarity of the applied DC power and the conductivity type (P or N) of the four Peltier junctions 14. The four Peltier junctions 14 are preferably attached to conductors 18 and 24 by soldering.

The heat transfer 22 channel and conductor 18 each have a square exterior and interior shapes when viewed in plan view such as that shown by FIG. 9. The shapes of these elements may be adjusted as desired and as appropriate to the size and shapes of the peltier junctions shown.

The Peltier junctions shown herein are preferably 0.6 mm square in cross section and are 1 mm in length. This size was selected (i) since it allows geometries where the sample volume is small (less than 200 nL) while at the same time allowing geometries with larger sample volumes when desired and (ii) because this particular size is currently commercially available. Of course, if other sizes of Peltier junctions are or become commercially available, or if Peltier junctions are specially made having still different sizes, then the sizes and geometries shown in the present application can be adjusted or modified as needed to accommodate that change in size.

Figure 13:
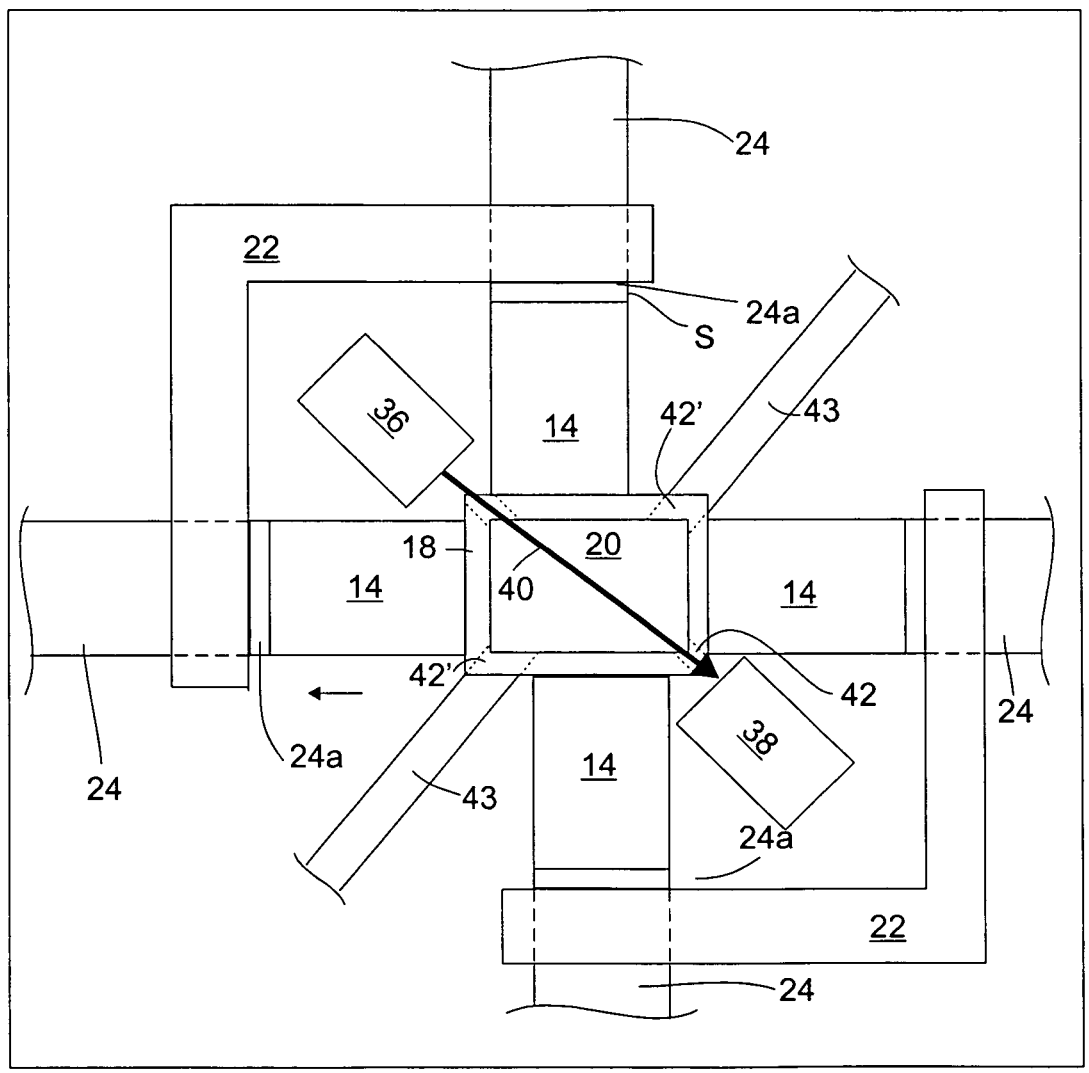
FIG. 13 is a plan view of an embodiment which is similar to that of FIG. 9 but in which the fluid channels communicating with the chamber occur at more or less the same level as the chamber as opposed to above and below it as is the case with the embodiment of FIGS. 9 and 10.

Instead of running the fluid channels via valves 34, the fluid channels may be connected directly to chamber 20 in layer 28 especially if the chamber 20 is elongated somewhat as shown in FIG. 13 and provided with additional apertures 42' for that purpose (which means that they are sealed to channels 43 which provide a fluid paths to and from chamber 20). If valves are not used, then other means can be used to control the flow of a sample to be tested into and out of chamber 20. If the sample is water soluble, then it may be easily moved by positioning it between small amounts of a non-reactive oil based fluid, such as mineral oil.

Figure 11:
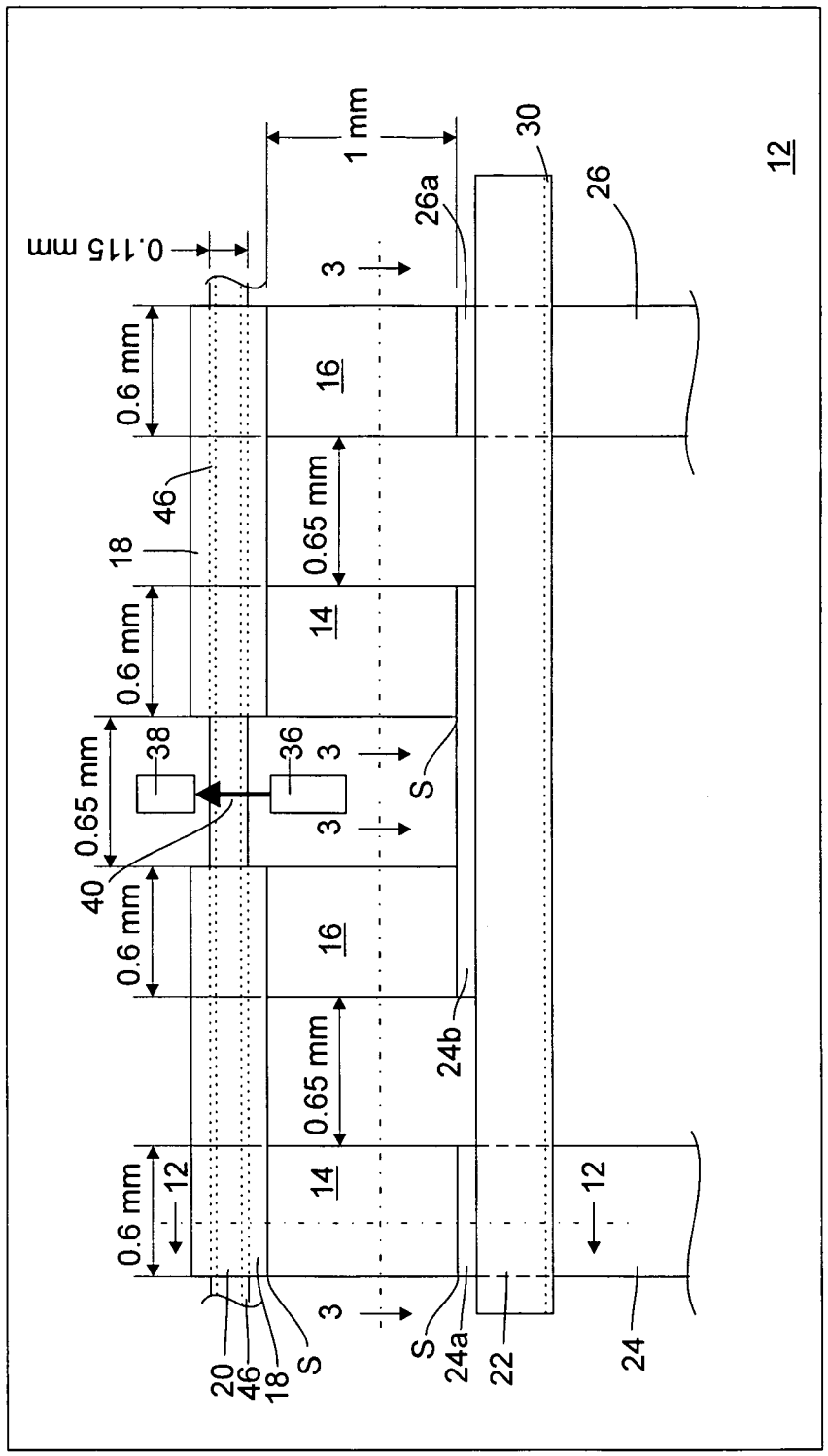
FIG. 11 is a plan view of an embodiment which preferably has four Peltier junction disposed along a glass tube or vessel having a central interior space for the sample receiving chamber.
Figure 12:
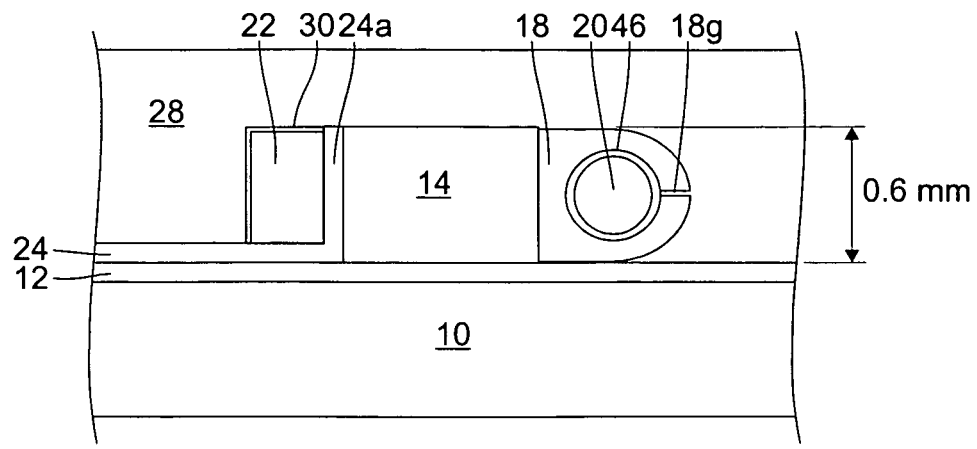
FIG. 12 is a side section view through the embodiment of FIG. 11 taken along line 12-12 thereof.

FIGS. 11 and 12 depict an embodiment with a glass envelope or tube 46 for enclosing the sample within the chamber 20. The glass tube 46 may be an optic fiber of the type having a small central aperture which forms the outer wall of chamber 20. The glass tube 46 can also be a capillary tube. Valves may be used at the ends of the tube 20 and/or the sample to be tested can be encapsulated at or near the end of tube 46 by using the mineral oil based fluid technique discussed above. Alternatively, at least one end of the glass tube 46 can be sealed, to form an envelope, and the other end can be similarly glass sealed or sealed using one the techniques discussed above.

In this embodiment, the buses 18 at the sample-side of each pair of Peltier junctions 14, 16 encircle the glass tube 46 (see FIG. 12) and preferably are in tight contact therewith to maximize heat flow into (or out of) a sample under test in chamber 20. A small optional gap 18g (see FIG. 12) may be utilized in the wall of buses 18 in order to provide some 'give' in order to help the fitting of tube 46 into buses 18. Note also that in this embodiment, that bus 18 has a flat surface confronting (and preferably soldered to) a flat surface of Peltier junction 14 (as specifically shown in FIG. 12) and also confronting (and preferably soldered to) to a similar flat surface of neighboring Peltier junction 16 (see FIG. 11). The shape of bus 18 can be simplified by making it from a small metallic (and preferably copper or other suitable conductor) tube. In that case, the confronting surface of the Peltier junctions 14, 16 should be preferably rounded to maximize heat transfer between the junctions 14, 16 and the chamber 20 inside the glass tube 46.

In the embodiment of FIGS. 11 and 12, a LED 36 and a PIN, diode, or photo avalanche diode 38 are again shown. But instead of traveling through bus 18, as is the case for the embodiments of FIGS. 9 and 13, the laser beam can be positioned between the two buses 18 used in this four Peltier junction embodiment. The number of Peltier junctions utilized will depend, at least in part, one the length of the chamber 20 and the amount of heating and/or cooling required, but those skilled in the art should be able to vary the number of Peltier junctions as needed and to modify the embodiment of FIGS. 11 and 12 to place possibly additional Peltier junctions in a confronting relationship in a manner similar to that depicted by FIG. 4. In FIG. 11 four Peltier junctions are connected in series with the aid of a bus 24b which couples, in series connection, the ends of the Peltier junctions facing away from the chamber 20 on the two Peltier junctions disposed next to the laser 40. Bus 24b is preferably formed of a metal such as copper and may encircle channel 22, if desired, in a manner similar to that of busses 18 in order to help improve heat from into (or from) heat transfer channel 22.

Figure 14:
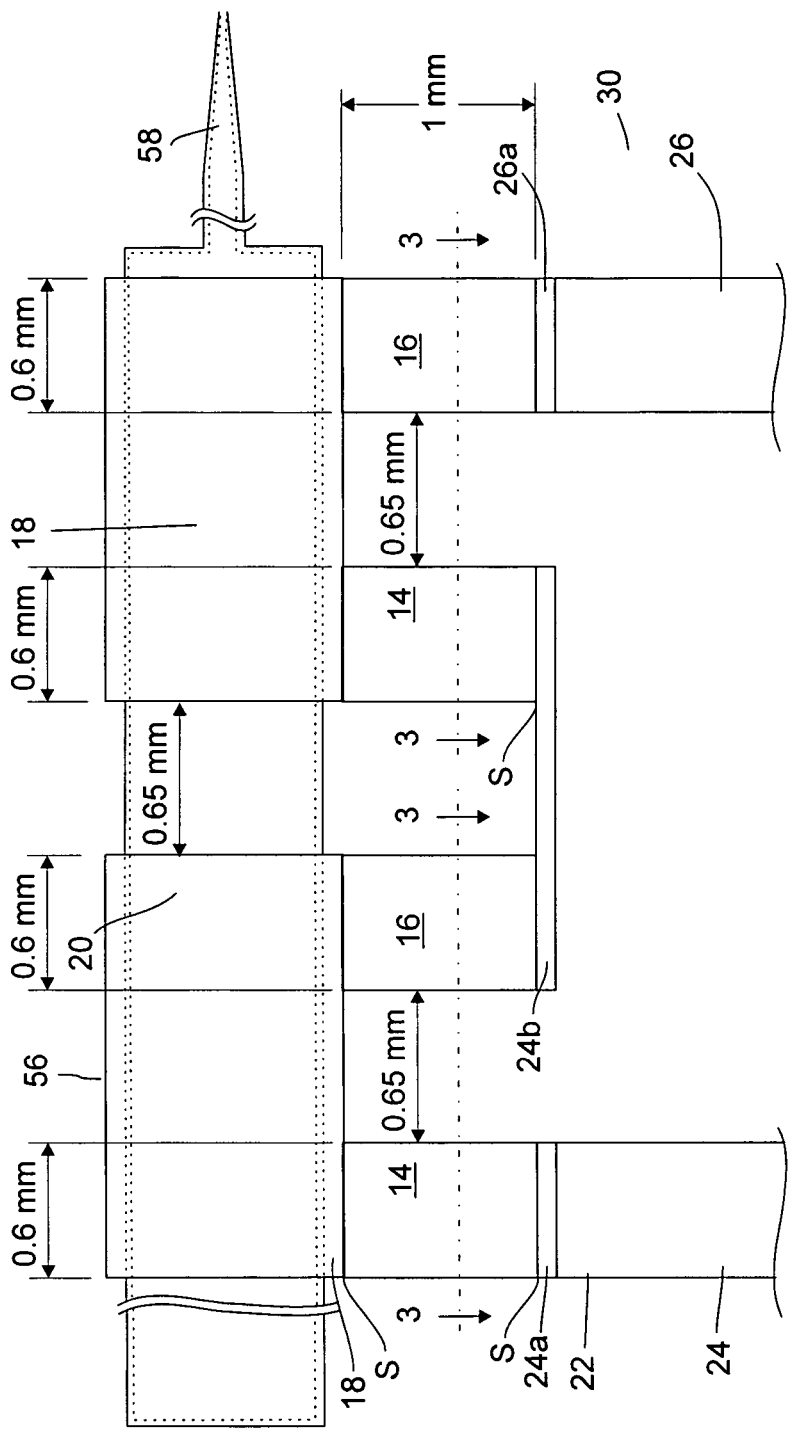
FIG. 14 is a side section view similar to the embodiment of FIG. 12, but in this embodiment the fluidic chamber is bigger and preferably comprises the body of a syringe.

FIG. 14 is a side section view an embodiment conceptually somewhat similar to the embodiment of FIG. 12, but in this embodiment the fluidic chamber 20 is considerably bigger and preferably comprises the body of a syringe 56. The fluidic chamber 20 is in fluid communication with the needle end 58 of the syringe 56 in the usual manner known in the art. The fluidic chamber 20 is sufficiently large to contain a volume of a drug for injection into a biological subject, such as a human being. Thus the volume of the fluidic chamber 20 would be on the order of 1 ml or so in this embodiment. The drug in chamber 20 of the syringe 56 can be maintained at a suitably low temperature if a source of electrical energy is supplied to Peltier junctions 14, 16 via busses 24, 26. In the field, the syringe 56 can be "powered" by batteries or preferably solar cells (not shown) in order to keep the volume of drug in chamber 20 at a suitable temperature until the syringe is needed to inject the drug.

In this embodiment, the substrate 10 and heat transfer channel 22 may be omitted. The busses 18 preferably encircle the chamber 20 of syringe 56 basically as shown in (and described with reference to) FIG. 12. A plurality of additional Peltier junctions 14, 16 may be positioned around the periphery of busses 18, particularly if busses 18 have (or has if only one is used) a circular shape in cross section. In that case a group of Peltier junctions at any one axial position along the axis of the syringe 56 would be coupled in parallel with one another while the various groups disposed axially along the axial length of the syringe 56 would be connected in series preferably as shown in FIG. 14 (assuming multiple groups are utilized).

The syringe 56 is intended to be used in places of the world or during emergencies where or when it is difficult for physicians to keep drugs at appropriate temperatures due to, for example, a lack of an appropriate working infrastructure. Solar powered syringes would help reduce the unwanted heating of drugs prior to injection. Air cooling of the hot side(s) of the Peltier junction can be aided by use of fins to dissipate heat into air around the syringe.

Having described this invention in connection with several embodiments thereof, further modification will now suggest itself to those skilled in the art. The invention is therefore not to be limited to the disclosed embodiment except as specifically required by the appended claims.

What is claimed is:

1. A microfluidic apparatus comprising a thermally insulating substrate and a heating/cooling device, wherein a contact surface of the thermally insulating substrate contacts at least partially the heating/cooling device, the heating/cooling device including:
- a heating/cooling chamber for heating and/or cooling a sample disposed in said chamber;
- a waste heat channel for carrying away waste heat and/or supplying thermal energy, the waste heat channel being fluidically disconnected from the heating/cooling chamber; and
- at least one Peltier junction having first and second opposing faces, the first face thereof facing towards said heating/cooling chamber and being in thermal communication therewith for providing either heat or cooling to said chamber in response to a flow of electrical current through said at least one Peltier junction, the second face thereof facing towards said waste heat channel and being in thermal communication therewith for either receiving heat from or dumping heat to said channel in response to a flow of electrical current through said at least one Peltier junction, wherein said at least one Peltier junction is thus configured to transfer heat between said heating/cooling chamber and said waste heat channel,
- wherein the heating/cooling chamber, the waste heat channel, the at least one Peltier junction and the thermally insulating substrate are configured to form a multilevel arrangement inside the microfluidic apparatus, a first level being composed of the thermally insulating substrate supporting a second level, the second level comprising the heating/cooling chamber, the waste heat channel, and the at least one Peltier junction, wherein the heating/cooling chamber, the waste channel and the at least one Peltier junction are arranged side by side within the second level along said contact surface, wherein the thermally insulating substrate is fluidically disconnected from the heating/cooling chamber and the waste heat channel.

2. The heating/cooling device for a microfluidic apparatus of claim 1 wherein the at least one Peltier junction comprises at least two Peltier junctions connected in series with a common bus bar connected between a first face of two of said at least two Peltier junctions, the common bus bar being formed from a metallic material and disposed to face said chamber for conducting thermal energy between said two of said at least two Peltier junctions and said chamber.

3. The heating/cooling device for a microfluidic apparatus of claim 2 wherein the at least one Peltier further comprises at least two additional Peltier junctions connected in series with an additional common bus bar connected between a first face of two of said at least two additional Peltier junctions, the additional common bus bar being formed from a metallic material and disposed to face said chamber to conduct thermal energy between said at least two additional Peltier junctions and said chamber.

4. The heating/cooling device for a microfluidic apparatus of claim 2 wherein the at least one Peltier further comprises at least two additional Peltier junctions connected in series and wherein said common bus bar coupled to a first face of two of said at least two additional Peltier junctions.

5. The heating/cooling device for a microfluidic apparatus of claim 4 wherein said chamber is formed from glass.

6. The heating/cooling device for a microfluidic apparatus of claim 5 wherein said chamber is a glass vessel.

7. The heating/cooling device for a microfluidic apparatus of claim 4 wherein said chamber is formed at least partially from polydimethylsiloxane having a fluid impervious coating thereon on surfaces of the polydimethylsiloxane facing said chamber.

8. The heating/cooling device for a microfluidic apparatus of claim 1 wherein said chamber is formed at least partially from polydimethylsiloxane having a fluid impervious coating thereon on surfaces of the polydimethylsiloxane facing said chamber.

9. The heating/cooling device for a microfluidic apparatus of claim 1 wherein said chamber is formed from an elongate glass tube.

10. The heating/cooling device for a microfluidic apparatus of claim 2 wherein said chamber is formed from an elongate glass tube.

11. The heating/cooling device for a microfluidic apparatus of claim 10, wherein said common bus bar at least partially surrounds an outer circumference of said elongate glass tube.

12. The heating/cooling device for a microfluidic apparatus of claim 11 wherein said elongate glass tube has a circular cross section.

13. The microfluidic apparatus of claim 1, further comprising an overlaying layer disposed on the heating/cooling device, wherein the overlaying layer is fluidically disconnected from the heating/cooling chamber.

14. The microfluidic apparatus of claim 1, wherein:
- the waste heat channel is configured for carrying away waste heat when the at least one Peltier junction is configured to cool the sample disposed in the heating/cooling chamber, and
- the waste heat channel is configured for carrying away waste cooling when the at least one Peltier junction is configured to heat the sample disposed in the heating/cooling chamber.

15. The microfluidic apparatus of claim 1, wherein the waste heat channel comprises a layer of liquid impervious material along exposed interior surfaces of the waste heat channel.

16. The microfluidic apparatus of claim 1, wherein the thermally insulating substrate comprises a layer of polydimethylsiloxane material.

17. The microfluidic apparatus of claim 1, wherein the heating/cooling device is disposed on the thermally insulating substrate.

* * * * *